United States Patent [19]

Bergendahl

[11] 4,399,205
[45] Aug. 16, 1983

[54] METHOD AND APPARATUS FOR DETERMINING PHOTOMASK ALIGNMENT

[75] Inventor: Albert S. Bergendahl, Underhill, Vt.

[73] Assignee: International Business Machines Corporation, Armonk, N.Y.

[21] Appl. No.: 325,942

[22] Filed: Nov. 30, 1981

[51] Int. Cl.³ .............................................. G03C 5/06
[52] U.S. Cl. .................................... 430/30; 430/313; 430/315; 430/320; 324/64; 324/65 R; 324/158 R
[58] Field of Search ............... 430/312, 314, 320, 315, 430/30; 357/41; 324/64, 65 R, 158 R; 29/574

[56] References Cited

U.S. PATENT DOCUMENTS

| | | | |
|---|---|---|---|
| 3,482,977 | 12/1969 | Baker | 96/36.2 |
| 3,808,527 | 4/1977 | Thomas | 324/65 R |
| 3,974,443 | 8/1976 | Thomas | 324/64 |
| 4,024,561 | 5/1977 | Ghatalia | 357/23 |
| 4,347,479 | 8/1982 | Cullet | 324/64 |

OTHER PUBLICATIONS

IBM TDB, vol. 23, #4, Sep. 1980, P. W. Grant, "Line Screen Mask", p. 1366.
IBM TDB, vol. 22, #10, Mar. 1980, H. Bickford et al., pp. 4440-4441, "Macro-Overlay Mask".
IBM TDB, vol. 20, #7, Dec. 1977, pp. 2682-2684, "Accurate Two Dimensional Measurement of Overlays".
IEEE Journal of Electron Devices, Apr. 1979, pp. 729-732, I. J. Stemp.
IBM TDB, vol. 20, #5, Oct. 1977, p. 1973, R. F. Broom, "Niobium Tunnel Junction Fabrication".
IBM TDB, vol. 19, #9, Feb. 1977, pp. 3481-3486, K. E. Beilstein et al., "MOSFET Devices to Determine Mask Alignments Electrically".

*Primary Examiner*—John E. Kittle
*Assistant Examiner*—José G. Dees
*Attorney, Agent, or Firm*—Francis J. Thornton

[57] ABSTRACT

This describes a method for electrically evaluating the overlay error of a photolithographic tool. In this process a reusable substrate bearing a fixed reference mark has a photolithographic tool defined metal liftoff pattern formed thereon to provide a pair of conductive lines by measuring the relative resistance of the lines with respect to one another the alignment of the tool defined pattern with regard to the reference mark may be determined and thus the overlay error of the tool established.

The reference mask is formed of an L-shaped recess in a substrate so that when a metal structure is deposited on the surface of the substrate across the mask it will be made discontinuous by the mark. To form the metal structure photoresist is applied to the substrate and is exposed and developed in a L-shaped liftoff mask pattern larger than the reference mark and arranged on both sides of the mask so that when a conductive layer is deposited over the exposed and developed photoresist the remaining photoresist and overlying conductor subsequently removed, there will remain on the substrate surface a pair of conductive lines. One reference edge of this conductive line is defined by the recess forming the reference mask and the second edge is defined by the lifting off of the developed photoresist created by the photo tool defined liftoff pattern. By measuring the resistance of predetermined segments of the deposited metal remaining on the substrate the difference in line width caused by misalignment of the photo tool with respect to the reference mask can be determined. Any such difference in linewidth represents the overlay mismatch caused by the tool. After measurements are completed the conductive lines can be stripped from the substrate and the substrate reused.

7 Claims, 9 Drawing Figures

METHOD AND APPARATUS FOR DETERMINING PHOTOMASK ALIGNMENT

FIELD OF THE INVENTION

This invention relates generally to photolithographic processes and more particularly to a method for monitoring the performance of photolithographic tooling.

In the semiconductor industry photolithographic techniques are widely used for performing various elements of the semiconductor device. Generally speaking, in forming integrated circuits, the present state of the art requires a multiplicity of photolithographic steps, many of which must be precisely aligned with previous steps performed on or to the underlying semiconductor substrate in which the integrated circuit is being created. At the present time to assure adequate alignment of each of the photographic steps with respect to the previous ones, the initial steps are generally greatly enlarged over that required thus reducing the efficiency of the process and the efficiency of the final device as well as adding to the cost of the device.

By employing the method of the present invention the apparatus utilized for aligning the masks can be more accurately calibrated.

DESCRIPTION OF THE PRIOR ART

The broad concept of determining mask overlay error by examining images provided by a combination of two mask images has been known.

For example, the article, "The Line Screen Mask" by P. W. Grant, which appeared in the IBM TDB, September 1980, p. 1366, teaches a gross, qualitative technique which enables visual determination of exposure caused overlay errors which can be visually identified without the aid of instruements. In this article the visual image is determined by the respective images of the two overlapping mask areas.

The article "Micro-Overlay Mask" by H. Bickford et al, appearing in the IBM TDB, March 1980, p. 4440 and p. 4441, is also of interest as it teaches an alignment overlay error technique in which a visual error image is defined by the respective edges of two different image patterns.

Still further an article entitled, "Accurate Two-Dimensional Measurement of Overlays" by H. R. Rottmann et al, appearing in the IBM TDB, December 1977, ps. 2482–2684, is of interest as it teaches another overlay error measurement technique which enables the measurement of various types of overlay errors by using two different reference masks.

Still further the article entitled, "Automatic Testing and Analysis of Misregistrations Found in Semiconductors" by I. J. Stemp et al, appearing in the IEEE Journal of Electron Devices, April 1979, pgs. 729–732, is pertinent as it teaches an electrical overlay error measurement technique in which a pair of conductive lines are formed by the the co-operation of two different mask images. The relative resistance of the lines are used to determine the alignment accuracy between the two images throughout the area of the wafer. This reference further describes a technique in which a doubly exposed photoresist on a chrome mask blank is used for defining pairs of conductive lines, the resistance of which is a function of overlay error.

Still further the article "Niobium Tunnel Junction Fabrication" by R. F. Broom, appearing in the IBM TDB, October 1977, p. 1973, is of interest in that it illustrates a double liftoff structure in which pairs of conductive layers can be deposited using different masking images to define the respective edges of the line. Still further U.S. Pat. No. 3,808,527 by Thomas and U.S. Pat. No. 4,024,561 by Ghatalia and the IBM TDB article of February 1977, pgs. 3481–3486, teach various electrical measurement techniques for measuring mask positioning accuracy between actual device structures formed by different mask images.

None of these references however describe the specific steps used in forming the conductive line pattern in the present invention nor do they employ the idea of using a reusable substrate in which the mask blanks can be stripped of its resistant line structures and retreated, thus, assuring a constant standard element in aligning and determining the alignment of the mask tool being utilized.

SUMMARY OF THE INVENTION

Accordingly it is an object of the invention to describe a method for more accurately establishing the overlay error of photolithographic tools by employing a reusable standard bearing a reference mask in conjunction with a metallic liftoff pattern defined by a photolithographic tool itself.

It is a further object of this invention to electrically evaluate this error by forming pairs of conductive lines on the standard, the relative resistance of which is set by the alignment between a fixed reference on the standard and a liftoff pattern defined upon the body by the tool and measuring and comparing the resistance of the lines.

These and other objects of the invention are obtained by a mask overlay error measurement technique for monitoring the performance of photolithographic tooling in which a reusable standard wafer containing a relief pattern is used in combination with a liftoff process to form an overlay pattern thereby establishing measurable characteristics of the pattern and using these characteristics to establish and determine the mask overlay error of the tool creating the mask.

Specifically, in the preferred embodiment, the invention accomplishes this by this method of characterizing the photolithographic process tool by utilizing the steps of providing a substrate having a substantially non-conductive surface in which a first relief image pattern is defined by first and second levels on the surface of the substrate, applying a layer of selectively etchable material over the surface of the substrate, forming a second relief image pattern in the layer of selectively etchable material to expose at least portions of the first and second level, the said second relief pattern being substantially defined by exposure of the selectively etchable material in the tool being characterized, depositing a layer of conductive material over said second relief image pattern and the exposed areas of the substrate, removing the remaining portions of the selectively etchable material and overlying portions of the conductive layer and finally measuring an electrical characteristic of at least two different portions of the conductive layer remaining, the measured characteristic being represented of the extent to which the photolithographic tool exposed second relief image is aligned with the first established relief image in the substrate.

It is a further object of the invention to provide faster, more accurate measurements of masking exposure overlay than the optical inspection techniques presently known and used. This process permits the employment of many more inspection sites per wafer and provides a fixed standard reference which is not destroyed and can be reused repeatedly.

The foregoing and other objects, features and advantages of the invention will be apparent from the following more particular description of the preferred embodiments of the invention as illustrated in the accompanying drawings in which;

DESCRIPTION OF THE PREFERRED EMBODIMENT

Figure 1:
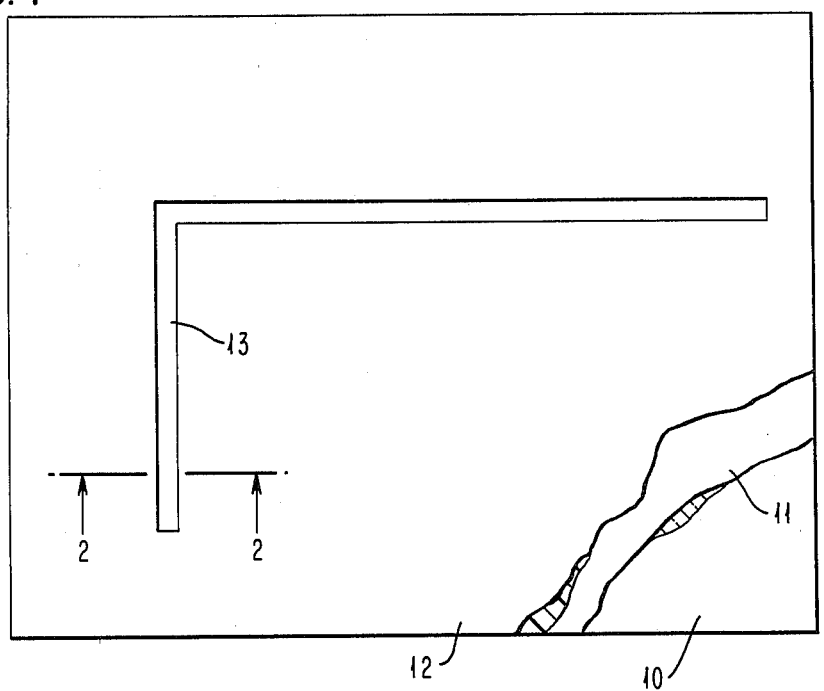
FIG. 1 is a plan view of the first step of providing the reusable standard with a reference mask.
Figure 2:
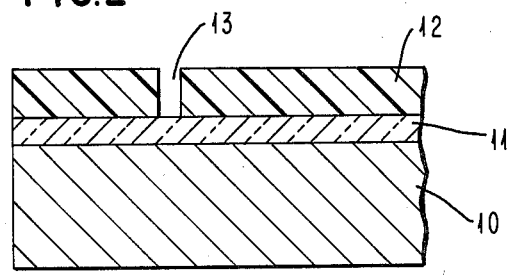
FIG. 2 is a cross section of the wafer of FIG. 1 taken along the lines 2—2.
Figure 3:
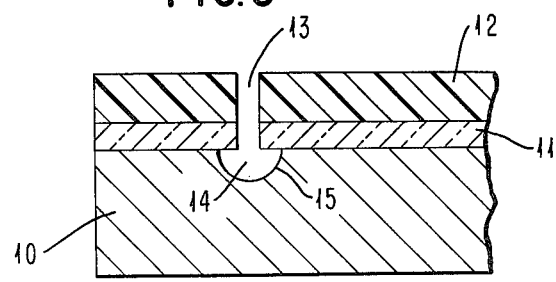
FIG. 3 shows the reference wafer taken along the lines 2—2 at a further step in the process.

The preferred embodiment of the invention will now be described in detail. As shown in FIG. 1, the first step in defining a photolithographic standard for use in the present invention comprises selecting a planar body 10 which may be comprised for example, of any suitable, etchable material such as silicon. Because silicon is semiconductive it must be overcoated with a layer of tightly adherent insulating material such as silicon dioxide 11. This layer 11 is in turn overcoated with a suitable exposure material such as photoresist 12. This photoresist layer 12 now has optically defined therein a L-shaped opening 13. This definition can be created by any of the known photolithographic techniques. Upon forming of the opening 13 the oxide layer 11 beneath the opening 13 is etched through using suitable etching material. This etching creates an L-shaped opening 14 in the oxide which is identical to the photolithographic defined opening 13. Using the opening 14 as a mask the underlying semiconductor body 10 has a cavity 15 etched therein as shown in FIG. 3. This cavity 15 generally conforms to the opening 14. However, because a chemical etchant is preferably used to form the cavity 15. The cavity extends beneath the oxide layer 11 so that the edges of opening 14 in the oxide are along the opening 15. Thus, there has been formed in the body 10 an L-shaped cavity 15 which is slightly larger than the opening 14.

Once the cavity 15 has been defined in the body 10 the layer 12 is stripped and precise measurements of the position of the cavity will repeat to the edge of the body 10 so that it can be used as a reference standard for determining the positioning and alignment of photolithographic tools with respect to the formed cavity 15.

Figure 4:
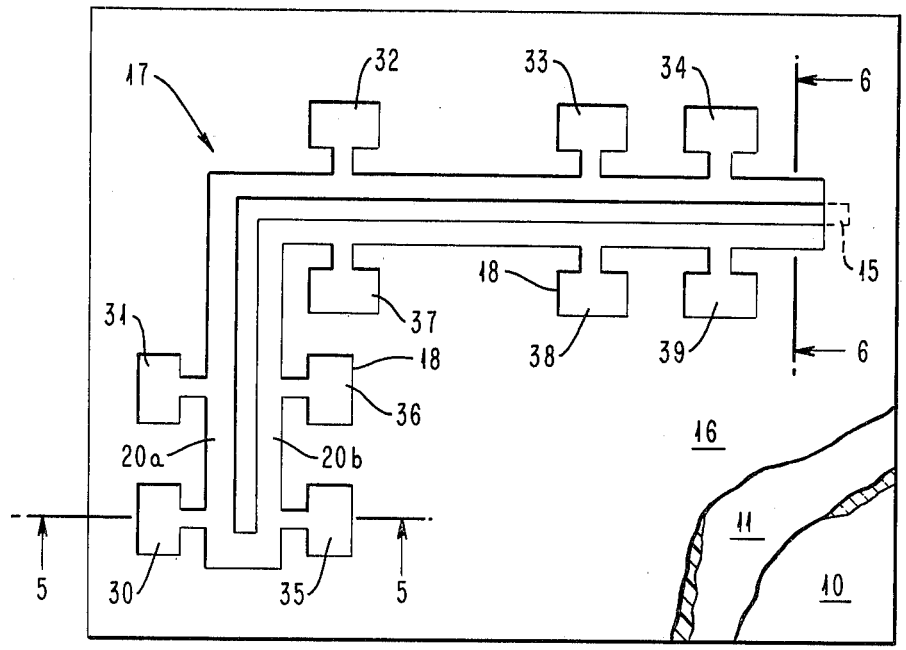
FIG. 4 shows the standard of FIG. 1 after a suitable pattern for measurement of the alignment of the wafer has been defined thereon.
Figure 5:
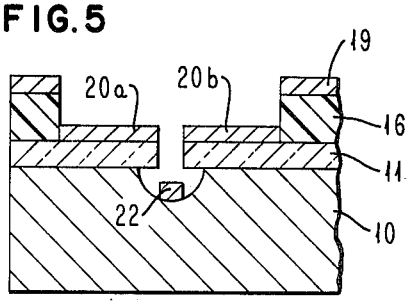
FIG. 5 shows a cross section of the standard of FIG. 4 taken along the lines by 5—5.
Figure 6:
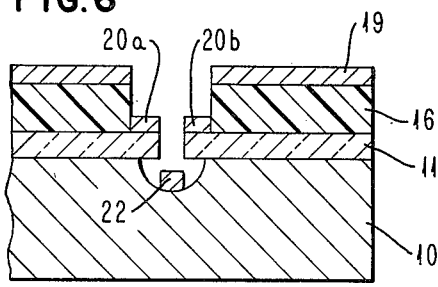
FIG. 6 shows the reference wafer taken along the lines 6—6.

When used as a standard, the formed substrate 10 having the cavity 15 formed therein now has a new layer of photoresist material 16 formed thereon as shown in FIG. 4. This layer 16 is now exposed by the photolithographic tool which is to be calibrated with respect to the standard with a pattern 17 also having an L-shape. This pattern 17 is aligned to the underlying formed aperature 15 in the silicon body as accurately as possible. Preferably this pattern 17 has on both sides a multiplicity of extended opposing lands 18 protruding therefrom. Thus, as shown in FIG. 5 across the lands the width of the pattern 17 formed in the layer 16 is considerably wider than the width of the pattern taken elsewhere and as shown in FIG. 6.

Figure 8:
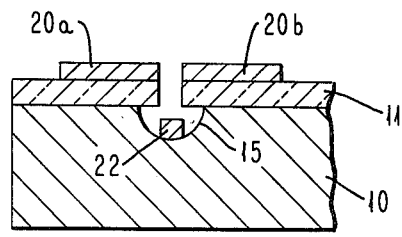
FIG. 8 illustrates the reference wafer of FIG. 4 taken along the lines 8—8 after liftoff.
Figure 9:
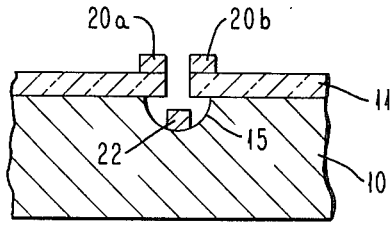
FIG. 9 illustrates the reference wafer taken along the lines 9—9 after liftoff.
Figure 7:
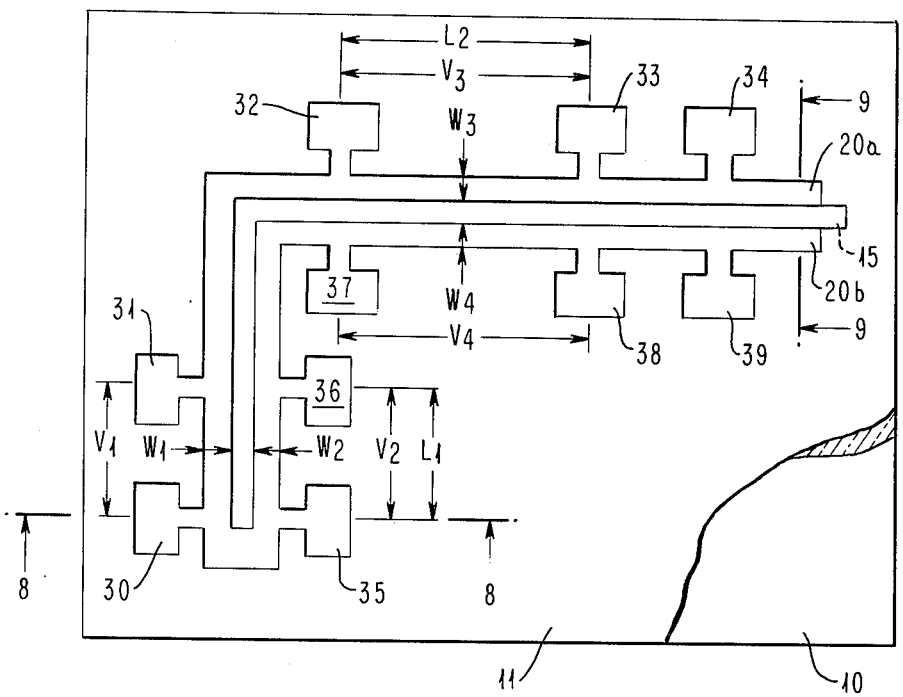
FIG. 7 shows the standard of FIG. 1 after lift-off.

Once the pattern 17 is formed in the layer 16 a suitable metallic deposit 19 such as aluminum is laid down over the entire unit. Such a metallic deposit 19 may be deposited by evaporation, sputtering or the like. It must be especially noted that the pattern 17 is formed over and aligned with the openings 14 and 15 formed in the oxide and underlying substrate. Once this metal layer has been laid down the photoresist material 16 still remaining is dissolved away. The removal of the layer 16 also lifts off the metal overlying it. This leaves a metallic pattern 20 which has a configuration in the form of the opening 17 defined in the photoresist 16. At this time, as shown in FIG. 7, the layer 16 has been removed leaving the conductive layer 20 extending on both sides of the opening 14 formed in the oxide. It should be noted that within the opening 15 there is a deposit of metal 22 conforming to the width of the opening 14 and which for all practical purposes can be ignored. FIGS. 8 and 9 shows the pattern 20 taken along the lines 8—8 and 9—9. In this way the formed pattern 20 is bifurcated. In order to determine the alignment of the mask, used to form the pattern 17, and thus the alignment of the photolithographic tool with respect to the previous defined openings 14 and 15, the invention uses the bifurcated pattern as two separate lines 20a and 20b. Each line generally is L-shaped and has a plurality of connected lands affixed thereto. Thus, for example line 20a has a plurality of lands 30, 31, 32, 33 and 34 connected thereto while line 20b also has a plurality of lands 35, 36, 37, 38 and 39 connected thereto. Lands 30, 35 are in opposition as are lands 31, 36, 32 and 37, 33 and 38, 34 and 39. Respectively these lines may now have more of their resistance measured to determine the overlay of the pattern 17 with respect to the fixed openings 14 and 15 formed in the underlying oxide and semiconductor body.

The manner in which this is accomplished is set forth below and can be used to evaluate, qualify or certify photolithographic tool performance without destruction of the reference mask and wafer sets.

This metallic pattern may be electrically tested to determine the overlay of it with respect to the structure comprising the openings 14 and 15 in the oxide and body to evaluate, qualify or certify the photolithographic tool performance without destruction of the reference mask and or wafer sets. This is possible because after electrical measurement the conductor pattern 17 can be removed from the reference wafer without damage to the structure comprised of openings 14 and 15.

As is well known the resistance of any metallic line is a function of the sheet resistance $\rho$ of the line, its width W and its length L. Thus $$W = \rho L / R = \rho L I / V$$

where V is the voltage applied between any two pads and I is the applied current flowing through the metal pattern.

If a current I is applied to pad 39 and caused to flow around the entire metal path to pad 34 and voltages are measured between selected pairs of pads, the difference in resistance of each segment of the line between pads can be determined so the width of each segment can be calculated. When each width is calculated one half of the difference between the width is the amount of shift of the metal pattern with respect to the structure defined in the substrate and thus the error in alignment of the photo tool.

Thus, if we assume that the distance between the center of pads 30 and 31, is L1, the applied voltage is V. Then the average width of the line between these pads is $W_1$. Similarly, between pads 35 and 36 the voltage is $V_2$, the distance also is $L_1$ and the average width $W_2$, between pads 32 and 33, the length is $L_2$, the voltage $V_3$, the width $W_3$ and between pads 37 and 38 the length is also $L_2$ the voltage $V_4$ and width $W_4$.

If we further assume X to be the distance that the pattern is shifted to the right or left from its center point the $$X = \frac{I\rho L_1}{2}\left(\frac{1}{V_2} - \frac{1}{V_1}\right)$$

and Y is the distance that the pattern 17 is shifted upon down from its center point, then $$Y = \frac{I\rho L_2}{2}\left(\frac{1}{V_4} - \frac{1}{V_3}\right)$$

If X is positive the pattern is shifted to the right if negative to the left.

Similarly if Y is positive the pattern is shifted up and if negative it is shifted down.

Thus, there has been described a precise overlay structure for electrical auto testing scheme for determining photolithographic overlay error using a fixed reusable reference.

What is claimed is:

1. The method of electrically characterizing the performance of a photolithographic exposure tool comprising the steps of:

providing a substrate standard, against which said tool may be characterized, having a substantially non-conductive surface in which a first relief image pattern is defined by first and second levels on the surface of said substrate, applying a layer of selectively etchable material over the surface of the substrate, forming a second relief image pattern in said layer of selectively etchable material to expose at least portions of said first and second levels, said second relief pattern being substantially defined by imagewise expose in the exposure tool to be characterized, said first relief image pattern defining and establishing at least one edge of said second pattern to thereby determine the alignment of that second relief pattern with respect to said standard, depositing a layer of conductive material over said second relief image pattern and exposed areas of said substrate, said first relief image pattern bifurcating said deposited layer of conductive material, removing the remaining portions of said selectively etchable material and overlying portions of said conductive layer, and measuring an electrical characteristic of at least two different portions of said bifurcated conductive layer remaining on one of said first and second levels, the measured characteristic being representative of the extent to which said photolithographic tool-exposed second relief image is aligned with and bifurcated by said first relief image in said substrate.

2. The method of claim 1 wherein said measurement comprises:

causing a current to flow through said conductive layer, measuring the voltages between at least three selected points on said layer, and determining the distance the pattern is shifted from the center of the first image relief pattern where, said distance is:

$$\frac{I\rho}{2}\left(\frac{L_2}{V_2} - \frac{L_1}{V_1}\right)$$

where I is the applied current, $\rho$ is the sheet resistance, $L_1$ is the distance between first two of said selected points, $L_2$ is the distance between a second two of said selected points, $V_1$ is the measured voltage between said first two selected points and $V_2$ is the measured voltage between said second two selected points.

3. The method of claim 2 wherein said substrate is formed of silicon and said non-conductive surface is silicon oxide formed thereon and said first relief image pattern is etched into said non-conductive surface.

4. The method of claim 3 wherein said selectively etchable material is a photoresist and said second relief image pattern is formed therein by exposing said photoresist to light and developing said exposed photoresist.

5. The method of claim 4 wherein said conductive material is deposited by evaporation.

6. The method of claim 4 wherein said conductive material is deposited by sputtering.

7. A standard against which a photolithographic exposure tool can be characterized comprising:

a substrate having a substantially planar surface in which a first relief image pattern is defined with first and second levels and over which a second relief image pattern is established such that said first relief image pattern defines and establishes at least one edge of said second pattern to thereby determine the alignment of that second pattern with respect to said standard.

* * * * *